(12) United States Patent
Kwon et al.

(10) Patent No.: US 12,516,241 B2
(45) Date of Patent: Jan. 6, 2026

(54) SEMICONDUCTOR NANOPARTICLES AND ELECTRONIC DEVICE INCLUDING THE SAME

(71) Applicants: SAMSUNG DISPLAY CO., LTD., Yongin-si (KR); Research & Business Foundation SUNGKYUNKWAN UNIVERSITY, Suwon-si (KR)

(72) Inventors: Sunyoung Kwon, Yongin-si (KR); Wanki Bae, Seoul (KR); Hakjune Lee, Suwon-si (KR); Youngsoo Kwon, Yongin-si (KR); Keunchan Oh, Yongin-si (KR); Hyeokjin Lee, Yongin-si (KR); Junhyuk Chang, Suwon-si (KR)

(73) Assignees: SAMSUNG DISPLAY CO., LTD, Gyeonggi-Do (KR); RESEARCH & BUSINESS FOUNDATION SUNGKYUNKWAN UNIVERSITY, Gyeonggi-Do (KR)

( * ) Notice: Subject to any disclaimer, the term of this patent is extended or adjusted under 35 U.S.C. 154(b) by 401 days.

(21) Appl. No.: 18/021,740

(22) PCT Filed: Oct. 8, 2020

(86) PCT No.: PCT/KR2020/095124
§ 371 (c)(1),
(2) Date: Feb. 16, 2023

(87) PCT Pub. No.: WO2022/039335
PCT Pub. Date: Feb. 24, 2022

(65) Prior Publication Data
US 2024/0026222 A1    Jan. 25, 2024

(30) Foreign Application Priority Data
Aug. 18, 2020  (KR) .................. 10-2020-0103430

(51) Int. Cl.
*C09K 11/88* (2006.01)
*B82Y 20/00* (2011.01)
(Continued)

(52) U.S. Cl.
CPC .......... *C09K 11/883* (2013.01); *H10H 20/812* (2025.01); *H10H 20/823* (2025.01); *B82Y 20/00* (2013.01); *B82Y 40/00* (2013.01)

(58) Field of Classification Search
CPC .. H10H 20/812; H10H 20/823; H01L 33/501; H01L 33/502; H10K 50/115;
(Continued)

(56) References Cited

U.S. PATENT DOCUMENTS 6,337,536 B1    1/2002  Matsubara et al.
6,815,064 B2   11/2004  Treadway et al.
(Continued)

FOREIGN PATENT DOCUMENTS

CA    2741825 C  * 11/2016 ............... C09C 1/04
CN    1155117 C     6/2004
(Continued)

OTHER PUBLICATIONS

KR Notice of Allowance Issued in Corresponding KR Patent Application No. 10-2020-0103430 Dated Oct. 8, 2024.
(Continued)

*Primary Examiner* — Scott B Geyer
(74) *Attorney, Agent, or Firm* — CANTOR COLBURN LLP

(57) ABSTRACT

A semiconductor nanoparticle includes a cluster consisting of a first semiconductor compound, a core covering at least a portion of the surface of the cluster and including a second semiconductor compound, and a shell covering at least a portion of the surface of the core and including a third semiconductor compound. The first semiconductor com-
(Continued)

pound and the third semiconductor compound each include zinc (Zn), the second semiconductor compound includes Zn, tellurium (Te), and selenium (Se), the first semiconductor compound and the second semiconductor compound are different from each other, and the second semiconductor compound and the third semiconductor compound are different from each other.

18 Claims, 7 Drawing Sheets

(51) Int. Cl.
   *B82Y 40/00* (2011.01)
   *H10H 20/812* (2025.01)
   *H10H 20/823* (2025.01)

(58) Field of Classification Search
   CPC ......... B82Y 20/00; B82Y 30/00; B82Y 40/00; C09K 11/02; C09K 11/08; C09K 11/883; C09K 11/565; C09K 11/56; C09K 11/88; C01B 19/00; C01B 19/04
   See application file for complete search history.

(56) References Cited

U.S. PATENT DOCUMENTS

| | | | |
|---|---|---|---|
| 7,316,967 B2* | 1/2008 | Yen | B01J 19/0093 |
| | | | 438/479 |
| 7,867,557 B2 | 1/2011 | Pickett et al. | |
| 8,507,094 B2 | 8/2013 | Woo et al. | |
| 9,842,962 B2 | 12/2017 | Woo et al. | |
| 10,008,631 B2* | 6/2018 | Breen | C09D 11/52 |
| 10,236,410 B2* | 3/2019 | Liu | C09K 11/565 |
| 11,319,487 B2 | 5/2022 | Lee et al. | |
| 11,566,345 B2 | 1/2023 | Kim et al. | |
| 2008/0220593 A1* | 9/2008 | Pickett | C01G 9/08 |
| | | | 257/618 |
| 2009/0108235 A1* | 4/2009 | Ando | C09K 11/883 |
| | | | 427/213.3 |
| 2015/0076494 A1 | 3/2015 | Pickett et al. | |
| 2018/0201834 A1 | 7/2018 | Banin et al. | |
| 2018/0327665 A1 | 11/2018 | Lee et al. | |
| 2019/0257003 A1* | 8/2019 | Kim | C09K 11/02 |
| 2019/0276737 A1* | 9/2019 | Won | C09K 11/02 |
| 2020/0017765 A1 | 1/2020 | Kim et al. | |
| 2020/0362240 A1* | 11/2020 | Yang | H10K 50/115 |

FOREIGN PATENT DOCUMENTS

| | | |
|---|---|---|
| CN | 110172348 A | 8/2019 |
| CN | 111218284 A | 6/2020 |
| EP | 3656833 A1 | 5/2020 |
| JP | 2010132906 A | 6/2010 |
| KR | 1020110133405 A | 12/2011 |
| KR | 101508568 B1 | 4/2015 |
| KR | 1020160120632 A | 10/2016 |
| KR | 1020170117619 A | 10/2017 |
| KR | 1020180124765 A | 11/2018 |
| KR | 1020190113323 A | 10/2019 |

OTHER PUBLICATIONS

Byeong Guk Jeong, et al;"Colloidal Spherical Quantum Wells with Near-Unity Photoluminescence Quantum Yield and Suppressed Blinking" ACS Nano 2016, 10, 10, 9297-9305.
Eun-Pyo Jang, et al; "Functional Nanostructured Materials (including low-D carbon) Synthesis of Alloyed ZnSeTe Quantum Dots as Bright, Color-Pure Blue Emitters"; ACS Appl. Mater. Interfaces 2019, 11, 49, 46062-46069.
International Search Report for PCT/KR2020/095124 dated May 13, 2021; 2 pages.
Extended European Search Report mailed Oct. 25, 2024 in EP Application No. 20950415.8, 10 pages.
Kim et al., "Efficient Blue-Light-Emitting Cd-Free Colloidal Quantum Well and Its Application in Electroluminescent Devices," Chemistry of Materials, 32 , pp. 5200-5207.

* cited by examiner

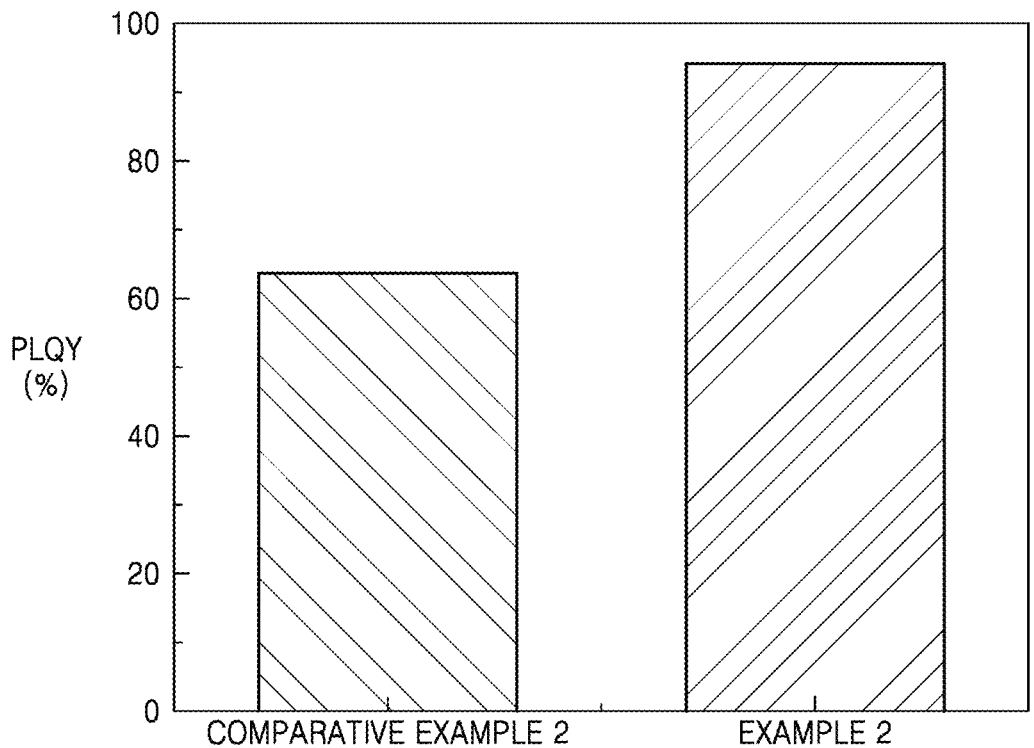
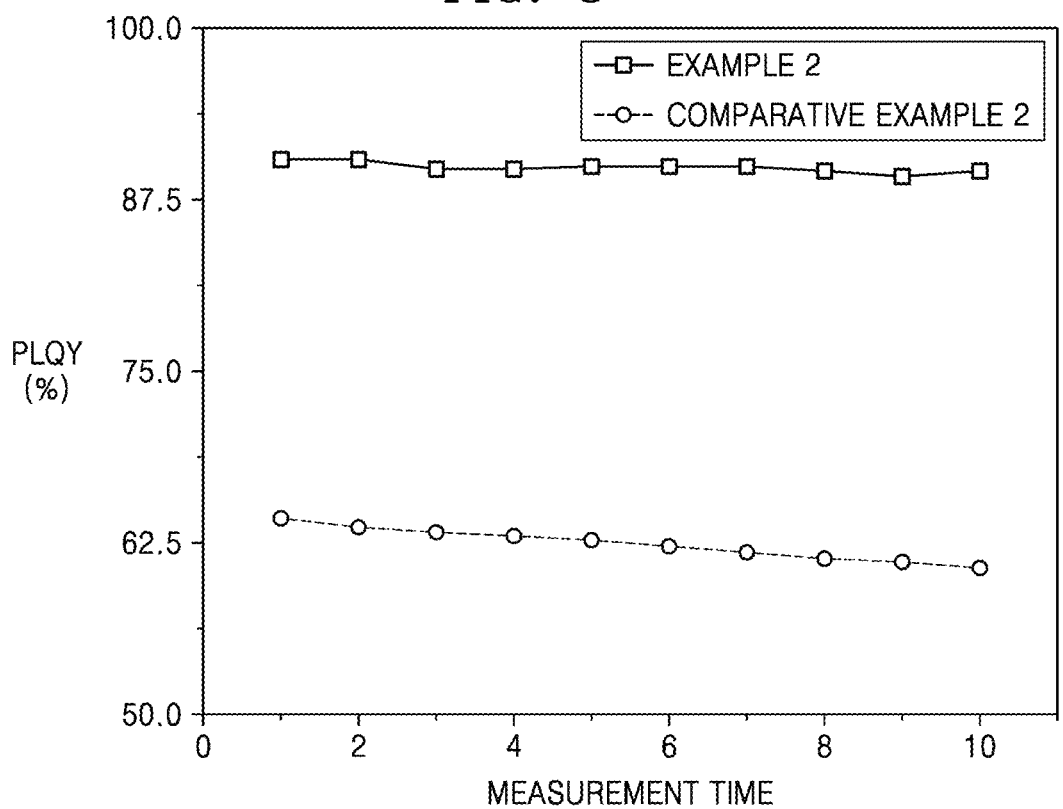

SEMICONDUCTOR NANOPARTICLES AND ELECTRONIC DEVICE INCLUDING THE SAME

This application is a national stage application of International Patent Application No. PCT/KR2020/095124, filed on Oct. 8, 2020, claiming priority to Korean Patent Application No. 10-2020-0103430, filed on Aug. 18, 2020, and all the benefits accruing therefrom under 35 U.S.C. § 119, the content of which in its entirety is herein incorporated by reference.

TECHNICAL FIELD

Provided are a semiconductor nanoparticle and an electronic device including the same.

BACKGROUND ART

Semiconductor nanoparticles, as nanoscale-sized crystalline materials with a size of several nanometers, exhibit a quantum confinement effect, and are also referred to as quantum dots.

The semiconductor nanoparticles receive light from an excitation source and thus enter an excited state, and thereafter emit energy corresponding to an energy band gap. Semiconductor nanoparticles exhibit characteristics such as excellent color purity and high luminous efficiency, and accordingly, may be used in various applications. In detail, semiconductor nanoparticles may be used in a lighting apparatus, a display apparatus, and the like.

DESCRIPTION OF EMBODIMENTS

Technical Problem

Provided are a semiconductor nanoparticle and an electronic device including the same. In detail, provided are a cadmium-free semiconductor nanoparticle and an electronic device including the same.

Solution to Problem

In an embodiment of the disclosure, a semiconductor nanoparticle includes a cluster including a first semiconductor compound, a core covering at least a surface of the cluster and including a second semiconductor compound, and a shell covering at least a surface of the core and including a third semiconductor compound. The first semiconductor compound and the third semiconductor compound each include zinc (Zn), the second semiconductor compound includes Zn, tellurium (Te), and selenium (Se), the first semiconductor compound and the second semiconductor compound are different from each other, and the second semiconductor compound and the third semiconductor compound are different from each other.

In an embodiment, the first semiconductor compound may include ZnSe.

In an embodiment, the second semiconductor compound may be represented by $ZnSe_{1-x}Te_x$. Here, x may satisfy $0.05 < x \leq 0.5$.

In an embodiment, x may satisfy $0.33 \leq x \leq 0.5$.

In an embodiment, the third semiconductor compound may include ZnSe or $ZnSe_yS_{1-y}$. Here, y may satisfy $0 \leq y < 1$.

In an embodiment, a band gap of the first semiconductor compound may be greater than that of the second semiconductor compound, and a band gap of the third semiconductor compound may be greater than that of the second semiconductor compound.

In an embodiment, the semiconductor nanoparticle may have a spherical quantum well.

In an embodiment, the semiconductor nanoparticle may emit light having a maximum emission wavelength in a range of about 445 nanometers (nm) to about 550 nm.

In an embodiment, the semiconductor nanoparticle may further include an outer shell that covers at least a surface of the shell and includes a fourth semiconductor compound. The fourth semiconductor compound may include a Group II element.

In an embodiment, the fourth semiconductor compound may include Zn, and may be a binary compound or a ternary compound.

In an embodiment, the fourth semiconductor compound may include ZnS, ZnSe, ZnTe, ZnO, ZnSeS, ZnSeTe, ZnSTe, or any combinations thereof.

In an embodiment, the semiconductor nanoparticle may emit light having a maximum emission wavelength in a range of about 470 nm to about 650 nm.

In an embodiment, the cluster may have an average diameter of less than or equal to about 0.5 nm.

In an embodiment, the core may have an average diameter in a range of about 2 nm to about 5 nm.

In an embodiment, the semiconductor nanoparticle may have an average diameter in a range of about 3 nm to about 13 nm.

In an embodiment of the disclosure, an electronic device includes a first substrate; a light-emitting device; and a second substrate. The second substrate may include the semiconductor nanoparticle.

In an embodiment, the semiconductor nanoparticle may be included in one area of the second substrate, and may absorb blue light and emit visible light.

In an embodiment, the second substrate may further include another area distinct from the one area, and the another area may not include the semiconductor nanoparticle, but may include a scatterer.

In an embodiment, the second substrate may be disposed in a traveling direction of light emitted from the light-emitting device.

In an embodiment of the disclosure, an electronic device includes a first electrode; a second electrode; and an interlayer arranged between the first electrode and the second electrode. The interlayer may include the semiconductor nanoparticle.

Advantageous Effects of Disclosure

In the semiconductor nanoparticle, the lattice mismatch between the core and the shell may be reduced, thereby improving light efficiency. In addition, the semiconductor nanoparticle may have a larger diameter as being prepared by a cluster. Therefore, the electronic device including the semiconductor nanoparticle may have improved efficiency and improved color purity.

BRIEF DESCRIPTION OF DRAWINGS

FIG. 7 is a diagram showing PL quantum yield ("QY") of Examples and Comparative Examples.

FIG. 8 is a diagram showing time-dependent photoluminescence quantum yield ("PLQY") of Examples and Comparative Examples.

MODE OF DISCLOSURE

Figure 1:
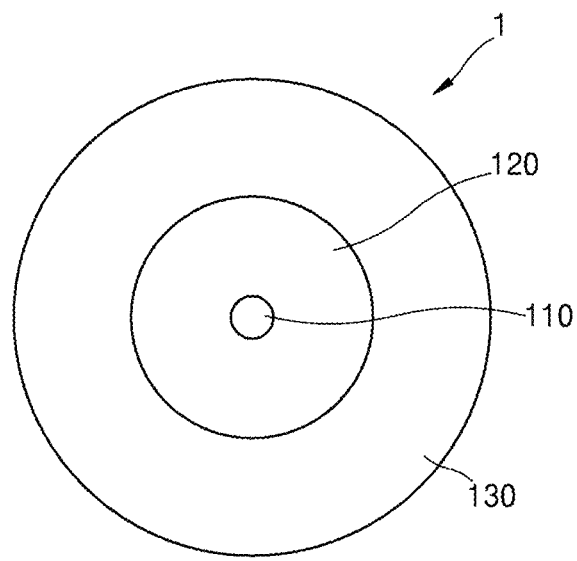
FIG. 1 is a schematic view of an embodiment of a semiconductor nanoparticle.

As the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

It will be understood that although the terms "first," "second," etc. used herein may be used herein to describe various components, these components should not be limited by these terms. These components are only used to distinguish one component from another.

An expression used in the singular encompasses the expression of the plural, unless it has a clearly different meaning in the context.

In the specification, it is to be understood that the terms such as "including," "having," and "comprising" are intended to indicate the existence of the features or components disclosed in the specification, and are not intended to preclude the possibility that one or more other features or components may exist or may be added. For example, unless otherwise limited, terms such as "including" or "having" may refer to either consisting of features or components described in the specification only or further including other components.

Like reference numerals in the drawings refer to like components, and the size of each component in the drawings may be exaggerated or reduced for clarity and convenience of description.

When a portion of a layer, film, region, plate, etc. is said to be "on" another portion, this includes not only the case in which the portion is "directly on" another portion, but also the case in which an intervening layer is placed therebetween. When a portion is placed "directly on" the other portion, this means that there is no intervening layer.

The term "maximum luminescence wavelength" used herein refers to a wavelength value corresponding to a point having a maximum emission intensity in a photoluminescence ("PL") spectrum of a solution or film sample including a compound.

The term "full width at half maximum ("FWHM")" used herein refers to a wavelength width at a point corresponding to ½ of a maximum emission intensity in the above-described PL spectrum.

The term "Group" used herein refers to a group on the international union of pure and applied chemistry ("IUPAC") Periodic Table of Elements.

The term "average diameter" used herein refers to an average value of diameters measured from all semiconductor nanoparticles included in any sample.

The term "average thickness" used herein refers to an average value of thicknesses measured from all semiconductor nanoparticles included in any sample.

Figure 2:
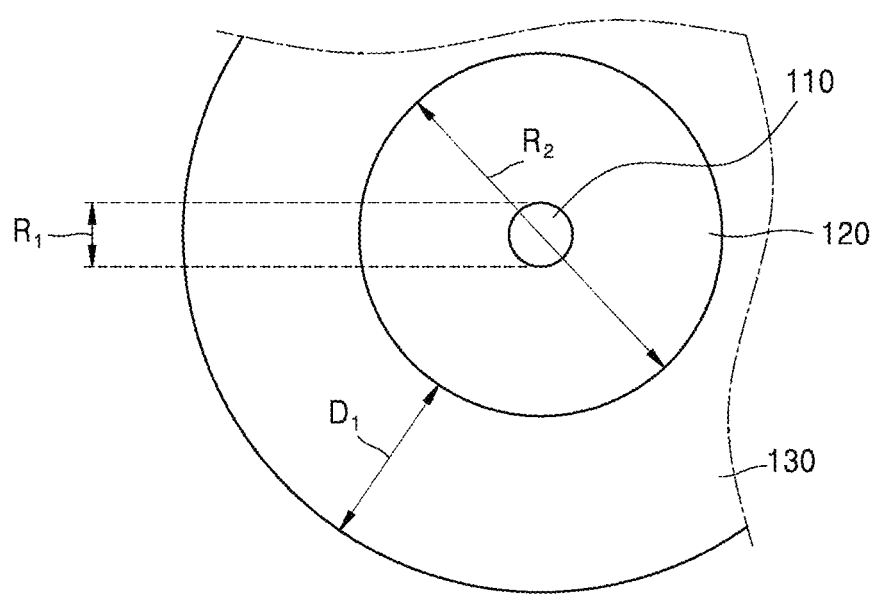
FIG. 2 is a partially enlarged view of FIG. 1.

Hereinafter, a semiconductor nanoparticle 1 in an embodiment will be described with reference to FIGS. 1 and 2.

The semiconductor nanoparticle 1 includes a cluster 110 including or consisting of a first semiconductor compound, a core 120 covering at least a surface of the cluster 110 and including a second semiconductor compound, and a shell 130 covering at least a surface of the core 120 and including a third semiconductor compound.

When the core 120 included in the semiconductor nanoparticle 1 grows to cover at least a surface of the cluster 110, a lattice of the second semiconductor compound may be formed in the lattice shape of the first semiconductor compound. Then, the shell 130 may be formed to cover at least a surface of the core 120, and as a result, lattice mismatch between the core 120 and the shell 130 may be reduced. Accordingly, the semiconductor nanoparticle 1 may have improved luminescence efficiency.

The first semiconductor compound may include zinc (Zn).

In an embodiment, the semiconductor nanoparticle 1 may not include a heavy metal such as cadmium (Cd). Although the semiconductor nanoparticle 1 does not include a heavy metal such as Cd, the semiconductor nanoparticle 1 may have a spherical quantum well ("SQW") structure by Zn.

In an embodiment, the first semiconductor compound may include Zn together with one or more selected from Group VI elements.

In embodiments, the first semiconductor compound may include Zn together with one or more selected from sulfur (S), selenium (Se) and tellurium (Te).

In an embodiment, the first semiconductor compound may be ZnSe.

In an embodiment, the cluster 110 may have an average diameter ($R_1$) of less than or equal to about 1.5 nanometers (nm). In embodiments, the cluster 110 may have an average diameter $R_1$ of less than or equal to about 1.4 nm. Since the average diameter $R_1$ of the cluster 110 is less than or equal to about 1.5 nm, the cluster 110 is distinguished from a commonly mentioned core in the art. In addition, since the average diameter $R_1$ of the cluster 110 is less than or equal to about 1.5 nm, the cluster 110 may not satisfy a band gap suitable for luminescence. Typically, a core or the like may have a diameter in a range of about 2 nm to about 7 nm.

The second semiconductor compound may include Zn, Te, and Se.

In an embodiment, the second semiconductor compound may be represented by $ZnSe_{1-x}Te_x$. Here, x may satisfy $0.05<x\leq0.5$, and refers to a compositional ratio of Te to Ze in $ZnSe_{1-x}Te_x$ included in the core 120 of the semiconductor nanoparticle 1. In an embodiment, when x is satisfied within a range of greater than 0.05 and less than or equal to 0.5, the semiconductor nanoparticle 1 may emit visible light, e.g., blue visible light or green visible light. In embodiments, when x is less than or equal to 0.05, the proportion of Te in the core 120 of the semiconductor nanoparticle 1 decreases so that an emission wavelength of the semiconductor nanoparticle 1 is shortened. Thus, the semiconductor nanoparticle 1 may not emit visible light, or may emit purple visible light. In embodiments, when x is less than or equal to 0.05, a thin film including the semiconductor nanoparticle 1 may have low absorbance for visible light, and thus an electronic device coupled with a light-emitting device emitting visible light may have reduced efficiency.

In an embodiment, x may satisfy $0.33 \leq x \leq 0.5$. When x satisfies $0.33 \leq x \leq 0.5$, the semiconductor nanoparticle 1 may emit green light, for example.

In an embodiment, the core 120 may include two or more types of the second semiconductor compound having different compositions. In an embodiment, the core 120 may include $ZnSe_{0.75}Te_{0.25}$, $ZnSe_{0.66}Te_{0.33}$, $ZnSe_{0.50}Te_{0.50}$, or any combinations thereof, for example.

In an embodiment, the core 120 may have an average diameter ($R_2$) in a range of about 2.0 nm to about 5.0 nm, e.g., greater than or equal to 2.5 nm, greater than or equal to 3 nm, greater than or equal to 3.2 nm, less than or equal to 4.5 nm, or less than or equal to 4 nm.

The third semiconductor compound may include Zn.

In an embodiment, the third semiconductor compound may include Zn together with one or more selected from Group VI elements.

In embodiments, the third semiconductor compound may include Zn together with one or more selected from S, Se, and Te.

In an embodiment, the third semiconductor compound may include ZnSe or $ZnSe_yS_{1-y}$. Here, y may satisfy $0 \leq y < 1$, and refers to a compositional ratio of Se to Zn in $ZnSe_yS_{1-y}$. When the third semiconductor compound includes ZnSe or $ZnSe_yS_{1-y}$, the lattice mismatch between the core 120 and the shell 130 may be reduced, thereby minimizing structural defects of nanoparticle. Accordingly, the shell may be formed to a be sufficiently thick, so as to improve stability of the semiconductor nanoparticle.

In an embodiment, the third semiconductor compound may include ZnSe, ZnSeS, or ZnS, for example.

In an embodiment, the shell may have an average thickness ($D_1$) in a range of 0.25 nm to 1.5 nm, and for example, the average thickness $D_1$ of the shell may be greater than or equal to 0.3 nm, greater than or equal to 0.4 nm, greater than or equal to 0.5 nm, less than or equal to 1.3 nm, less than or equal to 1.2 nm, or less than or equal to 1.1 nm.

The shell 130 may act as a protective layer which prevents chemical denaturation of the core 120 to maintain semiconductor characteristics, and/or as a charging layer which impart electrophoretic characteristics to the semiconductor nanoparticle.

The shell 130 may consist of a single layer or multiple layers, and an interface between the core 120 and the shell 130 may have a concentration gradient in which a concentration of an element in the shell 130 decreases toward the center.

The first semiconductor compound and the second semiconductor compound may be different from each other, and the second semiconductor compound and the third semiconductor compound may be different from each other.

In an embodiment, the first semiconductor compound and the third semiconductor compound may be identical to each other.

In an embodiment, the first semiconductor compound may be ZnSe, and the third semiconductor compound may be also ZnSe, for example, but the disclosure is not limited thereto.

In an embodiment, a band gap of the cluster 110 may be greater than that of the core 120, and a band gap of the shell 130 may be also greater than that of the core 120.

In an embodiment, the band gap of the cluster 110 may be in a range of 3.7 electronvolts (eV) to 3.72 eV, the band gap of the core 120 may be in a range of 2.4 eV to 2.95 eV, and the band of the shell 130 may be in a range of 2.82 eV to 3.2 eV, for example, but the disclosure is not limited thereto. When the above-described conditions are satisfied, the semiconductor nanoparticle 1 having improved efficiency and improved stability may be provided. In detail, when the band gaps are satisfied with the ranges above, the semiconductor nanoparticle having a Quasi-type II band structure, but having improved efficiency and improved stability may be provided.

In an embodiment, the semiconductor nanoparticle 1 may have an SQW.

The semiconductor nanoparticle 1 may emit visible light. In an embodiment, the semiconductor nanoparticle 1 may emit light having a maximum emission wavelength in a range of 445 nm to 550 nm, for example. In an embodiment, the semiconductor nanoparticle 1 may emit light having a maximum emission wavelength in a range of 480 nm to 540 nm. In embodiments, the semiconductor nanoparticle 1 may emit light having a maximum emission wavelength in a range of 530 nm to 540 nm. Accordingly, when the semiconductor nanoparticle 1 is applied to a color conversion member, blue or green color having high luminance and high color purity may be implemented.

In an embodiment, the semiconductor nanoparticle 1 may have an average diameter ($R_2+2D_1$) in a range of 3.0 nm to 13.0 nm. In an embodiment, the average diameter $R_2+2D_1$ of the semiconductor nanoparticle 1 may have may be greater than or equal to 4.0 nm, greater than or equal to 4.5 nm, greater than or equal to 5.0 nm, less than or equal to 7.0 nm, less than or equal to 6.5 nm, or less than or equal to 6.0 nm, for example.

In an embodiment, a full width at half maximum ("FWHM") of an emission wavelength spectrum of the semiconductor nanoparticle 1 may be less than or equal to nm, e.g., less than or equal to 55 nm or less than or equal to 40 nm. When the FWHM of the emission wavelength spectrum of the semiconductor nanoparticle 1 is satisfied within the ranges above, the semiconductor nanoparticle 1 may have high color purity, excellent color reproducibility, and a wide viewing angle.

In an embodiment, the semiconductor nanoparticle 1 may have reduced lattice mismatch between the core 120 and the shell 130, and have reduced generation of structural defects at the interface between the core 120 and the shell 130, so that the shell 120 may be formed to a sufficiently thickness. In embodiments, as the semiconductor nanoparticle 1 is prepared by the cluster 110, the semiconductor nanoparticle 1 may be prepared in a relatively large size. In this regard, the semiconductor nanoparticle in an embodiment may implement high efficiency and high color purity.

In an embodiment, a form of the semiconductor nanoparticle 1 is not specifically limited, and may be any one commonly used in the art. In an embodiment, the semiconductor nanoparticle 1 may be a spherical, pyramidal, multi-arm, or cubic nanoparticle, nanotube, nanowire, nanofiber, or nanoplate particle, for example.

In an embodiment, the semiconductor nanoparticle 1 may further include other compounds in addition to the above-described composition.

In an embodiment, the semiconductor nanoparticle 1 may include, in the core 120 or the shell 130, a Group II-VI compound, a Group III-VI compound, a Group III-V compound, a Group IV-VI compound, a Group IV element or compound, a Group compound, or any combinations thereof, for example.

In an embodiment, the Group II-VI compound may include a binary compound selected from CdS, CdSe, CdTe, ZnS, ZnSe, ZnTe, ZnO, HgS, HgSe, HgTe, MgSe, MgS, and any combinations thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any combinations thereof; a quaternary compound selected from CdZnSeS, CdZnSeTe, CdZnSTe, CdHgSeS, CdHgSeTe, CdHgSTe, HgZnSeS, HgZnSeTe, HgZnSTe, and any combinations thereof; or any combinations thereof, for example.

In an embodiment, The Group III-VI compound may include a binary compound selected from $In_2S_3$, $In_2Se_3$, and any combinations thereof; a ternary compound selected from $InGaS_3$, $InGaSe_3$, and any combinations thereof; or any combinations thereof, for example.

In an embodiment, the Group III-V compound may include a binary compound selected from GaN, GaP, GaAs, GaSb, AlN, AlP, AlAs, AlSb, InN, InP, InAs, InSb, and any combinations thereof; a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and any combinations thereof; a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any combinations thereof; or any combinations thereof, for example. The Group III-V semiconductor compound may further include a Group II metal (e.g., InZnP, etc.).

In an embodiment, the Group IV-VI compound may include a binary compound selected from SnS, SnSe, SnTe, PbS, PbSe, PbTe, and any combinations thereof; a ternary compound selected from SnSeS, SnSeTe, SnSTe, PbSeS, PbSeTe, PbSTe, SnPbS, SnPbSe, SnPbTe, and any combinations thereof; a quaternary compound selected from SnPbSSe, SnPbSeTe, SnPbSTe, and any combinations thereof; or any combinations thereof, for example.

In an embodiment, The Group IV element or compound may include a unary compound selected from Si, Ge, and any combinations thereof; a binary compound selected from SiC, SiGe, and any combinations thereof; or any combinations thereof, for example.

In an embodiment, the Group I-III-VI semiconductor compound may include a ternary compound selected from AgInS, $AgInS_2$, CuInS, $CuInS_2$, $CuGaO_2$, $AgGaO_2$, $AgAlO_2$, and any combinations thereof; or any combinations thereof, for example.

The binary compound, the ternary compound, or the quaternary compound may exist in particles at uniform concentration, or may exist in the same particle in a state in which a concentration distribution is partially different.

In an embodiment, the shell 130 may further include a metal oxide, a non-metal oxide, or any combinations thereof.

In an embodiment, the metal oxide or the non-metal oxide may be a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or the like; or a ternary compound, such as $MgAl_2O_4$, $CoFe_2O_4$, $NiFe_2O_4$, $CoMn_2O_4$, or the like, for example.

Figure 3:
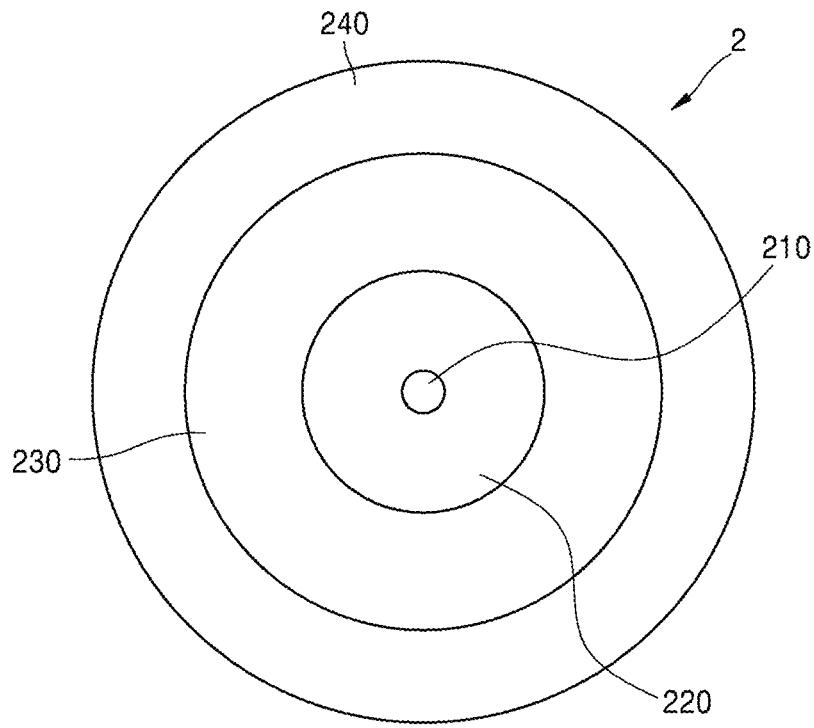
FIG. 3 is a schematic view of another embodiment of a semiconductor nanoparticle.
Figure 4:
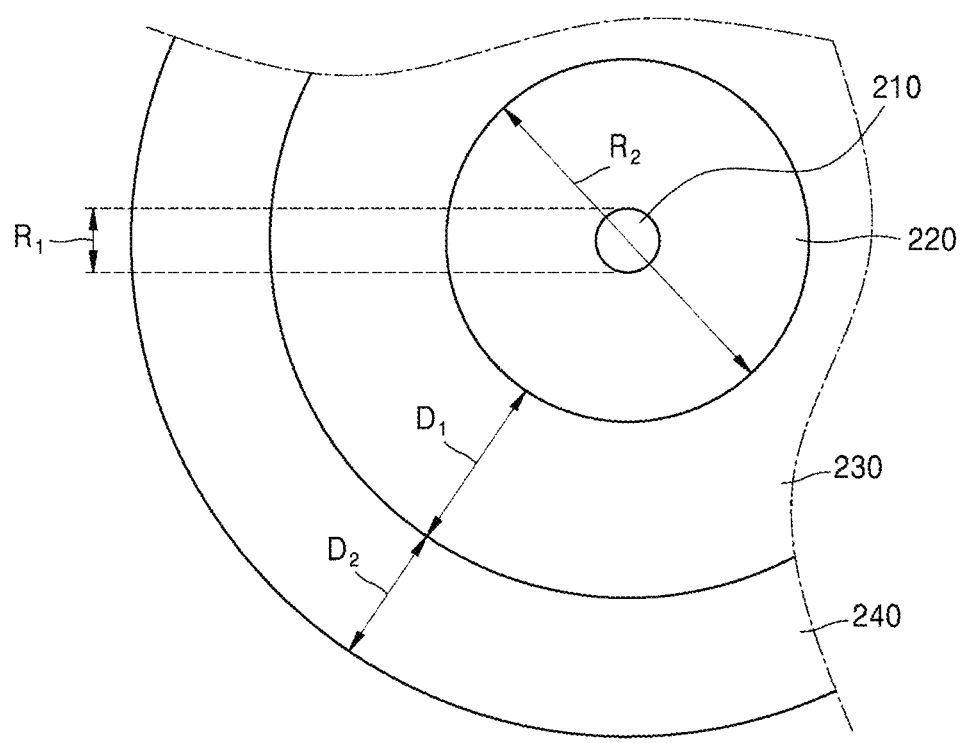
FIG. 4 is a partially enlarged view of FIG. 3.

Hereinafter, a semiconductor nanoparticle 2 in another embodiment will be described with reference to FIGS. 3 and 4.

The semiconductor nanoparticle 2 may include: a cluster 210 including or consisting of a first semiconductor compound; a core 220 covering at least a surface of the cluster 210 and including a second semiconductor compound; a first shell 230 covering at least a surface of the core 220 and including a third semiconductor compound; and a second shell 240 covering at least a surface of the first shell 230 and including a fourth semiconductor compound. Here, the first shell 230 and the second shell 240 may be also referred to as an inner shell and an outer shell, respectively. The descriptions of the first semiconductor compound, the second semiconductor compound, and the third semiconductor compound included in the semiconductor nanoparticle 2 may be referred to those described in connection with FIGS. 1 and 2, and may be the same as the first semiconductor compound, the second semiconductor compound, and the third semiconductor compound included in the semiconductor nanoparticle 1, respectively. Thus, overlapping descriptions will be omitted.

The fourth semiconductor compound may include a Group II element.

In an embodiment, the fourth semiconductor compound may include Zn, and may be a binary compound or a ternary compound.

In embodiments, the fourth semiconductor compound may include ZnS, ZnSe, ZnTe, ZnO, ZnSeS, ZnSeTe, or ZnSTe.

In embodiments, the first semiconductor compound may be ZnS.

In an embodiment, the outer shell may have an average thickness ($D_2$) in a range of 0.3 nm to 1.5 nm. In an embodiment, the average thickness $D_2$ of the outer shell 240 may be greater than or equal to 0.4 nm, greater than or equal to 0.5 nm, less than or equal to 1.4 nm, less than or equal to 1.3 nm, less than or equal to 1.2 nm, or less than or equal to 1.1 nm, for example.

The outer shell 240 may act as a protective layer which prevents chemical denaturation of the core 220 to maintain semiconductor characteristics, and/or as a charging layer which impart electrophoretic characteristics to the semiconductor nanoparticle 2.

The outer shell 240 may consist of a single layer or multiple layers, and an interface between the inner shell 230 and the outer shell 240 may have a concentration gradient in which a concentration of an element in the outer shell 240 decreases toward the center.

The semiconductor nanoparticle 2 may emit visible light other than blue light. The semiconductor nanoparticle 2 may emit light having a maximum emission wavelength in a range of 470 nm to 650 m. In an embodiment, the semiconductor nanoparticle 2 may emit light having a maximum emission wavelength in a range of 490 nm to 570 nm. Accordingly, when the semiconductor nanoparticle 2 is applied to a color conversion member, green color having high luminance and high color purity may be implemented.

In an embodiment, the semiconductor nanoparticle 2 may have an average diameter ($R_2+2D_1+2D_2$) in a range of 3.0 nm to 13.0 nm. In an embodiment, the average diameter $R_2+2D_1+2D_2$ of the semiconductor nanoparticle 2 may be greater than or equal to 4.0 nm, greater than or equal to 4.5 nm, greater than or equal to 5.0 nm, greater than or equal to 5.5 nm, greater than or equal to 6.0 nm, less than or equal to 10.0 nm, less than or equal to 9.5 nm, less than or equal to 9.0 nm, less than or equal to 8.5 nm, or less than or equal to 8.0 nm, for example.

In an embodiment, an FWHM of an emission wavelength spectrum of the semiconductor nanoparticle 2 may be less than or equal to 60 nm, e.g., less than or equal to 55 nm or less than or equal to 40 nm. When the FWHM of the emission wavelength spectrum of the semiconductor nanoparticle 2 is satisfied within the ranges above, the semiconductor nanoparticle 2 may have high color purity, excellent color reproducibility, and a wide viewing angle.

Hereinafter, an electronic device including the above-described semiconductor nanoparticle will be described.

The electronic device may include a light-emitting device including: the semiconductor nanoparticle and a first electrode; a second electrode; and an interlayer arranged between the first electrode and the second electrode.

In an embodiment, the electronic device may include a liquid crystal display apparatus, an organic light-emitting display apparatus, or an inorganic light-emitting display apparatus.

In an embodiment, when the electronic device further includes a liquid crystal, the electronic device may be a liquid crystal display apparatus, for example. Here, the light-emitting device may act as a light source, and the semiconductor nanoparticle may be included outside the light-emitting device and the liquid crystal to act as a color conversion member.

In an embodiment, in the case where the interlayer of the light-emitting device includes an emission layer and the emission layer includes an organic material, the electronic device may be an organic light-emitting display device. Here, the light-emitting device may act as a light source, and the semiconductor nanoparticle may be included outside the light-emitting device to act as a color conversion member.

In embodiments, in the case where the interlayer of the light-emitting device includes an emission layer and the emission layer includes an inorganic material such as the semiconductor nanoparticle, the electronic device may be an inorganic light-emitting display device.

The electronic device may further include a thin-film transistor in addition to the light-emitting device as described above. The thin-film transistor may include a source electrode, a drain electrode, and an activation layer. Any one of the source electrode and the drain electrode may be electrically connected to any one of the first electrode and the second electrode of the light-emitting device.

The thin-film transistor may further include a gate electrode, a gate insulating layer, or the like.

The active layer may include crystalline silicon, amorphous silicon, an organic semiconductor, an oxide semiconductor, or the like.

The electronic device may further include a sealing portion for sealing the light-emitting device. The sealing portion allows light from the light-emitting device to be extracted to the outside, and simultaneously prevents ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic device may be flexible.

Various functional layers may be additionally disposed on the sealing portion according to use of the electronic device. In embodiments, the functional layer is a color filter, a color conversion layer, a touch screen layer, and a polarizing layer. The touch screen layer may be a pressure-sensitive touch screen layer, a capacitive touch screen layer, or an infrared touch screen layer.

Figure 11:
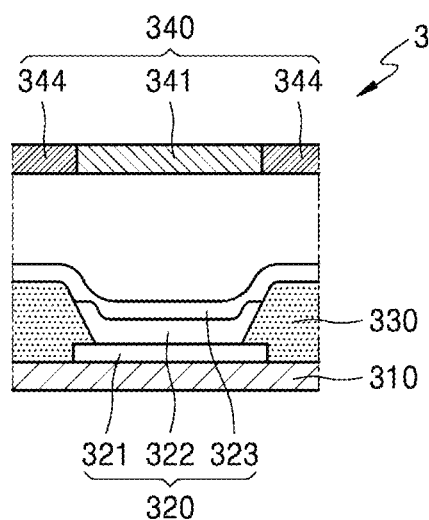
FIGS. 11 and 12 are each a schematic cross-sectional view of an embodiment of a structure of an electronic device.

Hereinafter, an electronic device 3 in an embodiment will be described in detail with reference to FIG. 11.

The electronic device 3 may include a first substrate 310, a light-emitting device 320, and a second substrate 340.

The semiconductor nanoparticle may be included outside the light-emitting device 320 (i.e., on a first electrode and/or a second electrode). In detail, the semiconductor nanoparticle may be included in the second substrate 340 disposed outside the light-emitting device 320. The second substrate 340 may function as a color conversion member, and the light-emitting device 320 may function as a light source.

The light-emitting device 320 may include a first electrode 321, a second electrode 323, and an interlayer 322 arranged between the first electrode 321 and the second electrode 323.

The electronic device 3 may be an organic light-emitting display device. Accordingly, the light-emitting device 320 may include an organic emission layer in the interlayer 322.

A pixel-defining layer 330 may be arranged on the first electrode 321. The pixel-defining layer 330 exposes a region of the first electrode 321, and the interlayer 322 may be arranged in the exposed region.

In an embodiment, a region 341 of the second substrate 340 may include the semiconductor nanoparticle. In this case, the second substrate 340 may be disposed in a direction which light emitted from the light-emitting device 320 travels.

The semiconductor nanoparticle may absorb blue light and emit visible light. Accordingly, the second substrate 340 may be designed to absorb blue light and emit light having a wide color range of wavelengths. Accordingly, the light-emitting device 320 may emit blue light having a maximum emission wavelength in a range of 400 nm to 490 nm, for example, and the thin film may absorb the blue light and emit visible light having a maximum emission wavelength in a range of 445 nm to 650 nm, for example.

In an embodiment, the second substrate 340 may further include a scatterer.

In an embodiment, the second substrate 340 may further include another region (not shown) different from the region 341, and the another region may not include the semiconductor nanoparticle, and the another region may transmit the blue light from the light-emitting device 320. In detail, only the region 341 may include the semiconductor nanoparticle, and the another region may include only the scatterer.

In an embodiment, the second substrate 340 may further include a light-shielding pattern 344 between the region 341 and the another region.

Figure 12:
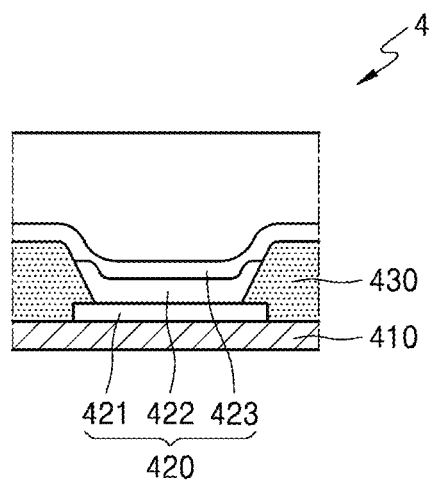

Hereinafter, an electronic device 4 in another embodiment will be described in detail with reference to FIG. 12.

The electronic device 4 includes a first substrate 410 and a light-emitting device 420.

The light-emitting device 420 includes a first electrode 421, a second electrode 423, and an interlayer 422 arranged between the first electrode 421 and the second electrode 423. In an embodiment, a pixel-defining layer 430 may be may be arranged on the first electrode 421.

The semiconductor nanoparticle may be included in the interlayer 422, e.g., in an emission layer included in the interlayer 422.

The semiconductor nanoparticle may emit visible light. Accordingly, the light-emitting device 420 may be designed to emit light having a wide color range of wavelengths. In an embodiment, the semiconductor nanoparticle may emit visible light having a maximum emission wavelength in a range of 445 nm to 650 nm, for example.

The interlayer 422 may further include an auxiliary layer between the emission layer and the first electrode 421 and/or between the emission layer and the second electrode 423. The auxiliary layer may directly contact the emission layer. The auxiliary layer may improve thin film characteristics of the emission layer.

The interlayer 422 may further include a first charge transport region between the emission layer and the first electrode 421 and/or a second charge transport region between the emission layer and the second electrode 423.

Hereinafter, a method of preparing the semiconductor nanoparticle will be described in detail.

The method of preparing the semiconductor nanoparticle includes forming a cluster including or consisting of a first semiconductor compound and then forming a core including a second semiconductor compound to cover at least a surface of the cluster; and forming a shell including a third semiconductor compound to cover at least a surface of the core.

The first semiconductor compound and the third semiconductor compound may each include Zn, and the second semiconductor compound may include Zn, Te, and Se. The first semiconductor compound and the second semiconductor compound may be different from each other, and the second semiconductor compound and the third semiconductor compound may be different from each other.

In an embodiment, a mixture of a precursor of the first semiconductor compound and a solvent may be allowed for a reaction at a cluster-forming temperature, e.g., a temperature in a range of 200 degrees Celsius (° C.) to 250° C., for example 230° C. to form a cluster including or consisting of the first semiconductor compound. The precursor of the first semiconductor compound essentially includes Zn.

The cluster thus formed does not undergo any separate isolation process, and a Se precursor and/or a Te precursor may be directly added thereto to form a core including the second semiconductor compound.

Since the cluster thus formed does not undergo any separate isolation process, a core that covers at least a portion of the cluster may be formed right on top of the cluster after the cluster grows. Accordingly, the core may grow along the lattice of the cluster. In an embodiment, when the cluster undergoes an isolation process, the highly reactive Se precursor and/or Te precursor may react with Zn to form a core that does not include the cluster, rather than a core that covers at least a portion of the cluster, for example. That is, when the cluster includes Cd, due to a large difference of reactivity to Zn, a core may not be formed according to the method described above.

Instead, after the Se precursor and/or the Te precursor is added to the cluster, a resultant combination may be allowed for a reaction at a temperature in a range of 200° C. to 250° C., e.g., at a temperature of 230° C. In an embodiment, after the Se precursor and/or the Te precursor is immediately added to mixture of precursor of the first semiconductor compound and the solvent, the reaction may proceed for 30 minutes to form a core, for example.

Next, a precursor of the third semiconductor compound may be added and reacted to form a shell. In an embodiment, a reaction temperature at which the shell is formed may be in a range of 280° C. to 320° C., e.g., 300° C. to 320° C., and a reaction time for which the shell is formed is 15 minutes.

In an embodiment, following the forming of the core, a purification process and/or a separation process or may be further performed or may be omitted.

In an embodiment, the solvent may be an organic solvent. In an embodiment, the solvent may be trioctylamine, oleylamine, 1-octadecene ("ODE"), or the like, for example.

Other details on the method of preparing the semiconductor nanoparticle will be understood by a person skilled in the art with reference to examples to be described later.

Hereinafter, semiconductor nanoparticles according to examples will be described in more detail.

EXAMPLES

Example 1: Synthesis of ZnSe/ZeSe$_{0.66}$Te$_{0.33}$/ZnSe Semiconductor Nanoparticle In a three-necked flask, 0.6 mmol of zinc oleate and 10 mL of 1-ODE were added. 0.2 mmol of diphenylphosphine selenide was added thereto at 230° C., and then right after, 0.1 mmol of trioctylphosphine telluride was added. The mixture was allowed for a reaction for 30 minutes.

Next, 1 mmol of zinc oleate and 1 mmol of trioctylphosphine selenide were added thereto and then allowed for a reaction for 15 minutes at a temperature raised to 300° C., thereby forming a zinc selenide shell and a semiconductor nanoparticle of Example 1.

Figure 9:
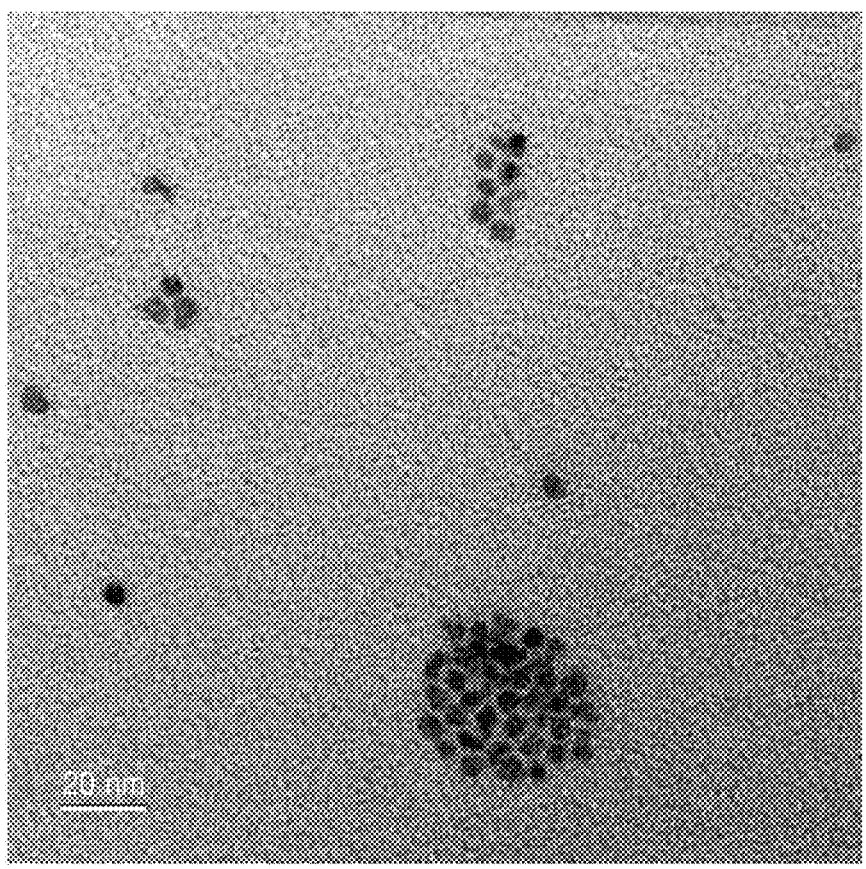
FIG. 9 is a transmission electron microscopy ("TEM") image of Example 1.

The semiconductor nanoparticle of Example 1 included a ZnSe cluster, a ZeSe$_{0.66}$Te$_{0.33}$ core, and a ZnSe shell. FIG. 9 shows a transmission electron microscopy ("TEM") image of the semiconductor nanoparticle of Example 1.

Example 2: Synthesis of ZnSe/ZeSe$_{0.66}$Te$_{0.33}$/ZnSe/ ZnS Semiconductor Nanoparticle In a three-necked flask, 0.6 mmol of zinc oleate and 10 mL of 1-ODE were added. 0.2 mmol of diphenylphosphine selenide was added thereto at 230° C., and then, right after 0.1 mmol of trioctylphosphine telluride was added. The mixture was allowed for a reaction for 30 minutes.

Next, 1 mmol of zinc oleate and 1 mmol of trioctylphosphine selenide were added thereto and then allowed for a reaction for 15 minutes at a temperature raised to 300° C., thereby forming a zinc selenide shell.

Then, 2 mmol zinc oleate and 2 mmol trioctylphosphine sulfide were added thereto and reacted for 1 hour to form a zinc sulfide shell to obtain a semiconductor nanoparticle of Example 2.

Figure 10:
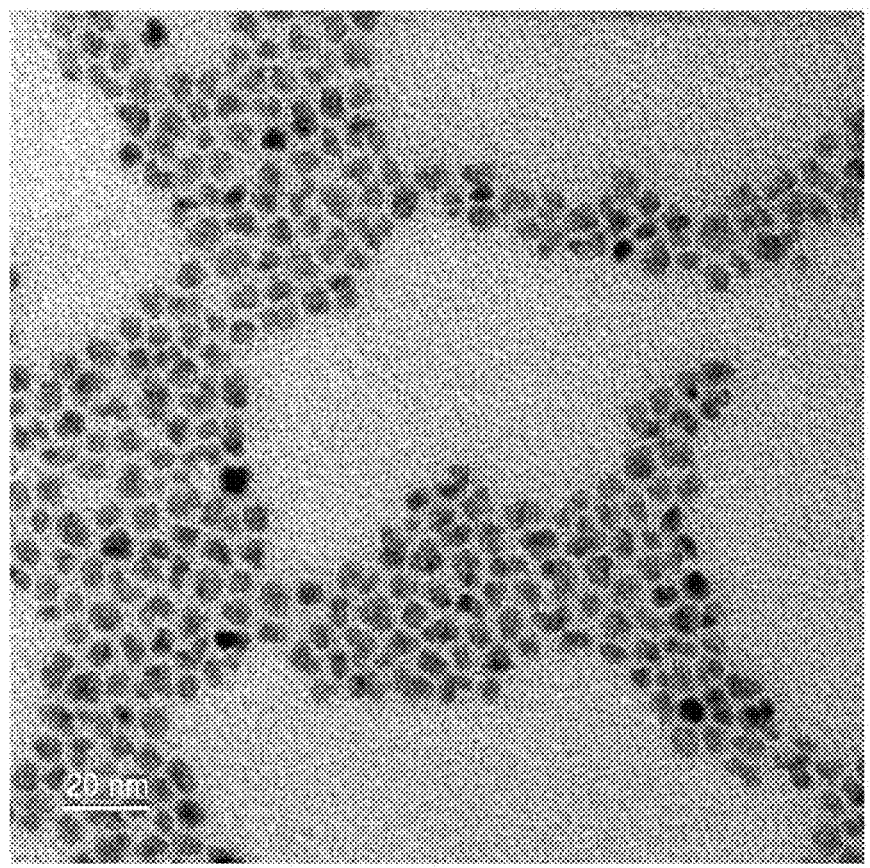
FIG. 10 is a TEM image of Example 2.

The semiconductor nanoparticle of Example 2 included a ZnSe cluster, a ZeSe$_{0.66}$Te$_{0.33}$ core, a ZnSe shell, and a ZnS outer shell. FIG. 10 shows a TEM image of the semiconductor nanoparticle of Example 2.

Comparative Example 1: Synthesis of ZeSe$_{0.66}$Te$_{0.33}$/ZnSe Semiconductor Nanoparticle In a three-necked flask, 0.6 mmol of zinc oleate, 0.2 mmol of diphenylphosphine selenide, 0.1 mmol of trioctylphosphine telluride, and 10 mL of 1-ODC were added at the same time and allowed for a reaction at 230° C. for 30 minutes.

Next, 1 mmol of zinc oleate and 1 mmol of trioctylphosphine selenide were added thereto and then allowed for a reaction for 15 minutes at a temperature raised to 300° C., thereby forming a zinc selenide shell and a semiconductor nanoparticle of Comparative Example 1.

Comparative Example 2: Synthesis of ZeSe$_{0.66}$Te$_{0.33}$/ZnSe/ZnS Semiconductor Nanoparticle In a three-necked flask, 0.6 mmol of zinc oleate, 0.2 mmol of diphenylphosphine selenide, 0.1 mmol of trioctylphosphine telluride, and 10 mL of 1-ODC were added at the same time and allowed for a reaction at 230° C. for 30 minutes.

Next, 1 mmol of zinc oleate and 1 mmol of trioctylphosphine selenide were added thereto and then allowed for a reaction for 15 minutes at a temperature raised to 300° C., thereby forming a zinc selenide shell.

Then, 2 mmol zinc oleate and 2 mmol trioctylphosphine sulfide were added thereto and reacted for 1 hour to form a zinc sulfide shell to obtain a semiconductor nanoparticle of Comparative Example 2.

Comparative Example 3: Synthesis of ZnSe/ZeSe$_{0.66}$Te$_{0.33}$ Semiconductor Nanoparticle In a three-necked flask, 0.6 mmol of zinc oleate and 10 mL of 1-ODE were added. 0.2 mmol of diphenylphosphine selenide was added thereto at 230° C., and then, right after 0.1 mmol of trioctylphosphine telluride was added. The mixture was allowed for a reaction for 30 minutes at 230° C. to obtain a semiconductor nanoparticle of Comparative Example 3.

Comparative Example 4: Synthesis of ZnSe Semiconductor Nanoparticle

In a three-necked flask, 0.6 mmol of zinc oleate and 10 mL of 1-ODE were added. 0.2 mmol of diphenylphosphine selenide was added thereto at 230° C., and then, 0.2 mmol of trioctylphosphine telluride was added. The mixture was allowed for a reaction for 15 minutes at a temperature raised to 300° C. to obtain a semiconductor nanoparticle of Comparative Example 4.

Evaluation Example 1

Each of the semiconductor nanoparticles of Examples 1 and 2 and Comparative Examples 1 to 4 was evaluated in terms of an ultraviolet-visible ("UV-Vis") spectrum, a PL spectrum, a maximum emission wavelength, an FWHM, and a photoluminescence quantum yield ("PLQY"), and results thereof are shown in Table 1 and FIGS. 5 to 8. Here, the PLQY was measured by dispersing the semiconductor nanoparticles in toluene and adjusting absorbance to be 0.1 at 450 nm.

TABLE 1

| | Semiconductor nanoparticle | Maximum emission wavelength (nm) | FWHM (nm) | PLQY (%) |
|---|---|---|---|---|
| Example 1 | ZnSe/ZeSe$_{0.66}$Te$_{0.33}$/ZnSe | 510 | 41 | 85 |
| Example 2 | ZnSe/ZeSe$_{0.66}$Te$_{0.33}$/ZnSe/ZnS | 525 | 45 | 95 |
| Comparative Example 1 | ZeSe$_{0.66}$Te$_{0.33}$/ZnSe | 508 | 47 | 55 |
| Comparative Example 2 | ZeSe$_{0.66}$Te$_{0.33}$/ZnSe/ZnS | 520 | 51 | 65 |
| Comparative Example 3 | ZnSe/ZeSe$_{0.66}$Te$_{0.33}$ | 491 | 42 | 75 |
| Comparative Example 4 | ZnSe | 430 | 22 | 70 |

Referring to Table 1, it was confirmed that the semiconductor nanoparticles of Examples 1 and 2 had a narrow FWHM and an excellent PLQY.

Figure 6:
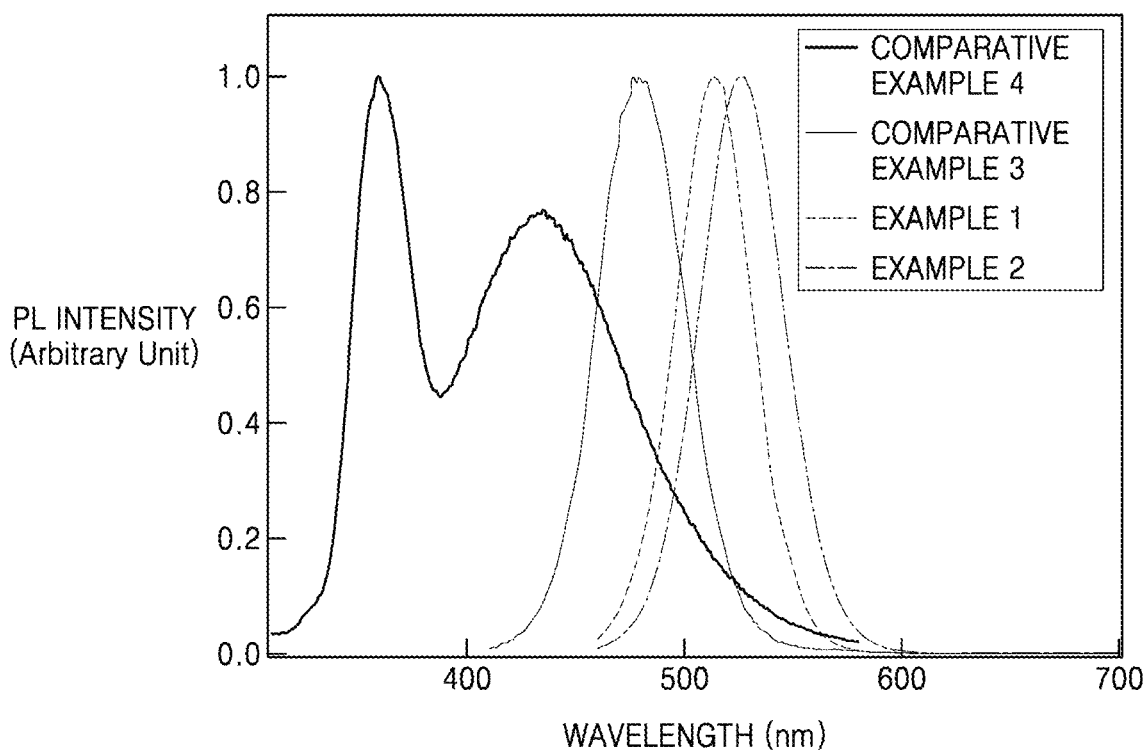
FIG. 6 is a diagram showing photoluminescence ("PL") spectra of Examples and Comparative Examples.

In addition, referring to Table 1 and FIG. 6, it was confirmed that, unlike the semiconductor nanoparticles of Examples 1 and 2 that emitted green light, the semiconductor nanoparticles of Comparative Examples 3 and 4 emitted visible light having a maximum emission wavelength of less than 500 nm.

Figure 5:
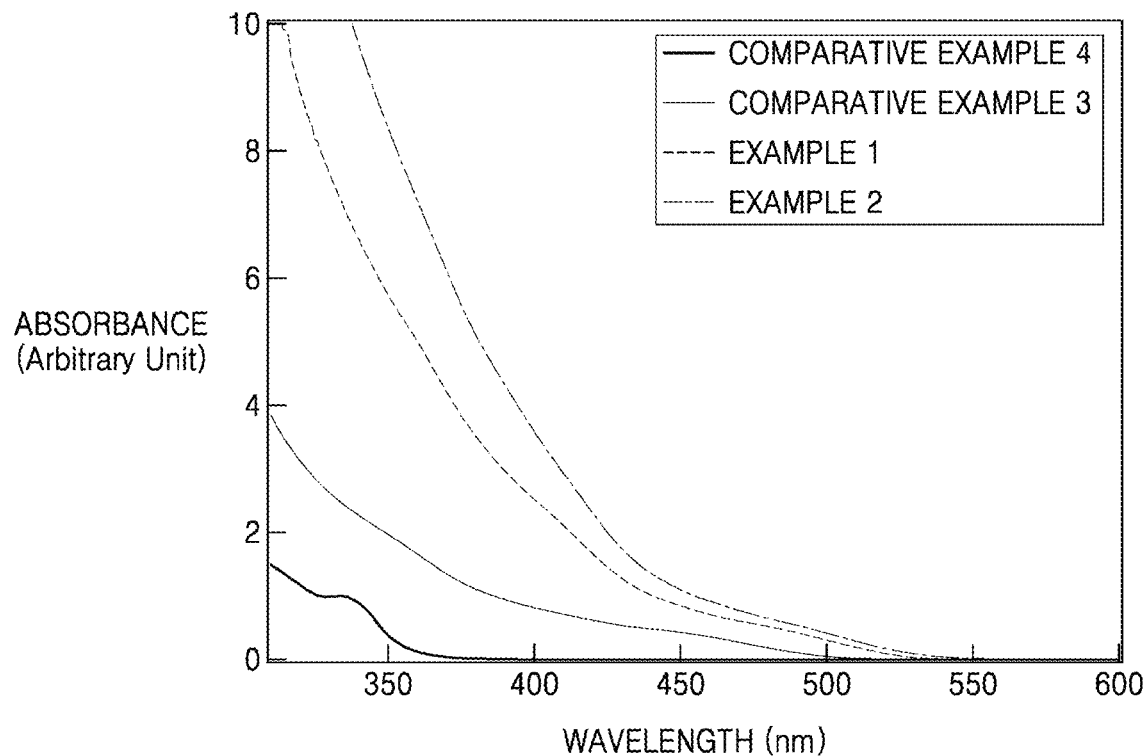
FIG. 5 is a diagram showing ultraviolet-visible ("UV-Vis") absorption spectra of Examples and Comparative Examples.

Referring to FIG. 5, it was confirmed that the semiconductor nanoparticles of Examples 1 and 2 had high absorbance for blue light compared to the semiconductor nanoparticles of Comparative Examples 3 and 4.

Referring to Table 1 and FIG. 7, it was confirmed that the semiconductor nanoparticle of Example 2 including the cluster had a significantly improved PLQY compared to the semiconductor nanoparticle of Comparative Example 2 not including the cluster.

Referring to FIG. 8, it was confirmed that the semiconductor nanoparticle of Example 2 including the cluster had a significantly longer lifespan than the semiconductor nanoparticle of Comparative Example 2 not including the cluster.

The invention claimed is:

1. A semiconductor nanoparticle comprising:
   a cluster consisting of a first semiconductor compound;
   a core covering at least a portion of a surface of the cluster and comprising a second semiconductor compound; and
   a shell covering at least a portion of a surface of the core and comprising a third semiconductor compound,
   wherein the first semiconductor compound and the third semiconductor compound each comprise zinc (Zn),
   the second semiconductor compound comprises zinc (Zn), tellurium (Te), and selenium (Se),
   the first semiconductor compound and the second semiconductor compound are different from each other,
   the second semiconductor compound and the third semiconductor compound are different from each other, and
   the first semiconductor compound comprises ZnSe.

2. The semiconductor nanoparticle of claim 1, wherein the second semiconductor compound is represented by ZnSe$_{1-x}$Te$_x$, and
   x satisfies 0.05<x≤0.5.

3. The semiconductor nanoparticle of claim 2, wherein x satisfies 0.33≤x≤0.5.

4. The semiconductor nanoparticle of claim 1, wherein the third semiconductor compound comprises ZnSe or ZnSe$_y$S$_{1-y}$, and
   y satisfies 0≤y<1.

5. The semiconductor nanoparticle of claim 1, wherein a band gap of the cluster is greater than that of the core, and
   a band gap of the shell is greater than that of the core.

6. The semiconductor nanoparticle of claim 1, wherein the semiconductor nanoparticle has a spherical quantum well.

7. The semiconductor nanoparticle of claim 1, wherein the semiconductor nanoparticle emits light having a maximum emission wavelength in a range of 445 nanometers to 550 nanometers.

8. The semiconductor nanoparticle of claim 1, further comprising an outer shell covering at least a portion of a surface of the shell and comprising a fourth semiconductor compound,
   wherein the fourth semiconductor compound comprises a Group II element.

9. The semiconductor nanoparticle of claim 8, wherein the fourth semiconductor compound comprises zinc (Zn), and is a binary compound or a ternary compound.

10. The semiconductor nanoparticle of claim 8, wherein the fourth semiconductor compound comprises ZnS, ZnSe, ZnTe, ZnO, ZnSeS, ZnSeTe, ZnSTe, or any combination thereof.

11. The semiconductor nanoparticle of claim 8, wherein the semiconductor nanoparticle emits light having a maximum emission wavelength in a range of 470 nanometers to 650 nanometers.

12. The semiconductor nanoparticle of claim 1, wherein an average diameter of the cluster is less than or equal to 1.5 nanometers.

13. The semiconductor nanoparticle of claim 1, wherein an average diameter of the core is in a range of 2.0 nanometers to 5.0 nanometers.

14. The semiconductor nanoparticle of claim 1, wherein an average diameter of the semiconductor nanoparticle is in a range of 3.0 nanometers to 13.0 nanometers.

15. An electronic device comprising:
a first substrate;
a light-emitting device; and
a second substrate comprising:
a semiconductor nanoparticle comprising:
a cluster consisting of a first semiconductor compound;
a core covering at least a portion of a surface of the cluster and comprising a second semiconductor compound; and
a shell covering at least a portion of a surface of the core and comprising a third semiconductor compound,
wherein the first semiconductor compound and the third semiconductor compound each comprise zinc (Zn),
the second semiconductor compound comprises zinc (Zn), tellurium (Te), and selenium (Se),
the first semiconductor compound and the second semiconductor compound are different from each other, and
the second semiconductor compound and the third semiconductor compound are different from each other,
wherein the semiconductor nanoparticle is comprised in one region of the second substrate, and
the semiconductor nanoparticle absorbs blue light and emits visible light.

16. The electronic device of claim 8, wherein the second substrate further includes another region distinct from the one region, and
the another region comprises a scatterer, and does not comprise the semiconductor nanoparticle.

17. The electronic device of claim 15, wherein the second substrate is disposed in a direction in which light emitted from the light-emitting device travels.

18. An electronic device comprising:
a first electrode;
a second electrode; and
an interlayer between the first electrode and the second electrode, the interlayer comprising:
a semiconductor nanoparticle comprising:
a cluster consisting of a first semiconductor compound;
a core covering at least a portion of a surface of the cluster and comprising a second semiconductor compound; and
a shell covering at least a portion of a surface of the core and comprising a third semiconductor compound,
wherein the first semiconductor compound and the third semiconductor compound each comprise zinc (Zn),
the second semiconductor compound comprises zinc (Zn), tellurium (Te), and selenium (Se),
the first semiconductor compound and the second semiconductor compound are different from each other,
the second semiconductor compound and the third semiconductor compound are different from each other, and
the first semiconductor compound comprises ZnSe.

* * * * *